US012622238B2

(12) United States Patent
Nagel et al.

(10) Patent No.: US 12,622,238 B2
(45) Date of Patent: May 5, 2026

(54) DEVICE AND METHOD FOR FABRICATING A PATTERNED FD-SOI WAFER INCLUDING EXPOSED BURIED OXIDE

(71) Applicant: Microchip Technology Incorporated, Chandler, AZ (US)

(72) Inventors: Steve Nagel, Chandler, AZ (US); Bomy Chen, Newark, CA (US)

(73) Assignee: Microchip Technology Incorporated, Chandler, AZ (US)

(*) Notice: Subject to any disclaimer, the term of this patent is extended or adjusted under 35 U.S.C. 154(b) by 420 days.

(21) Appl. No.: 18/200,688

(22) Filed: May 23, 2023

(65) Prior Publication Data

US 2024/0170325 A1 May 23, 2024

Related U.S. Application Data

(60) Provisional application No. 63/426,657, filed on Nov. 18, 2022.

(51) Int. Cl.
H10D 86/00 (2025.01)
H10P 90/00 (2026.01)
H10W 10/10 (2026.01)

(52) U.S. Cl.
CPC ....... H10P 90/1914 (2026.01); H10D 86/201 (2025.01); H10W 10/181 (2026.01)

(58) Field of Classification Search
CPC ........ H01L 21/76251; H01L 21/76254; H10D 86/201
See application file for complete search history.

(56) References Cited

U.S. PATENT DOCUMENTS

| | | | |
|---|---|---|---|
| 5,238,865 A | 8/1993 | Eguchi | 438/406 |
| 5,286,670 A * | 2/1994 | Kang | H10D 1/68 |
| | | | 148/DIG. 135 |
| 11,197,322 B2 | 12/2021 | Iyer et al. | |
| 2016/0315611 A1 | 10/2016 | Rana et al. | 327/537 |
| 2022/0051934 A1 | 2/2022 | Schwarzenbach | |
| 2023/0207382 A1* | 6/2023 | Bertrand | H01L 21/76254 |
| | | | 438/458 |

FOREIGN PATENT DOCUMENTS

JP          0245953 A          2/1990 ............. H01L 21/02

OTHER PUBLICATIONS

International Search Report and Written Opinion, Application No. PCT/US2023/079797, 13 pages.

* cited by examiner

*Primary Examiner* — Nelson Garces
(74) *Attorney, Agent, or Firm* — SLAYDEN GRUBERT BEARD PLLC

(57) ABSTRACT

Methods for preparing a donor silicon wafer by applying a SiGe layer on a silicon substrate wafer, depositing a silicon layer on the SiGe layer, etching the silicon layer to form an opening in the silicon layer, wet etching the SiGe layer through the opening in the silicon layer to partially remove SiGe material from the SiGe layer and preserve the silicon layer, depositing a buried oxide layer on the silicon layer, etching the buried oxide layer to form a body bias area, and depositing silicon in the body bias area; bonding a recipient handle wafer to the etched buried oxide layer of the donor silicon wafer to define a BOX; and wet etching the SiGe layer to release the donor silicon wafer from the recipient handle wafer.

20 Claims, 9 Drawing Sheets

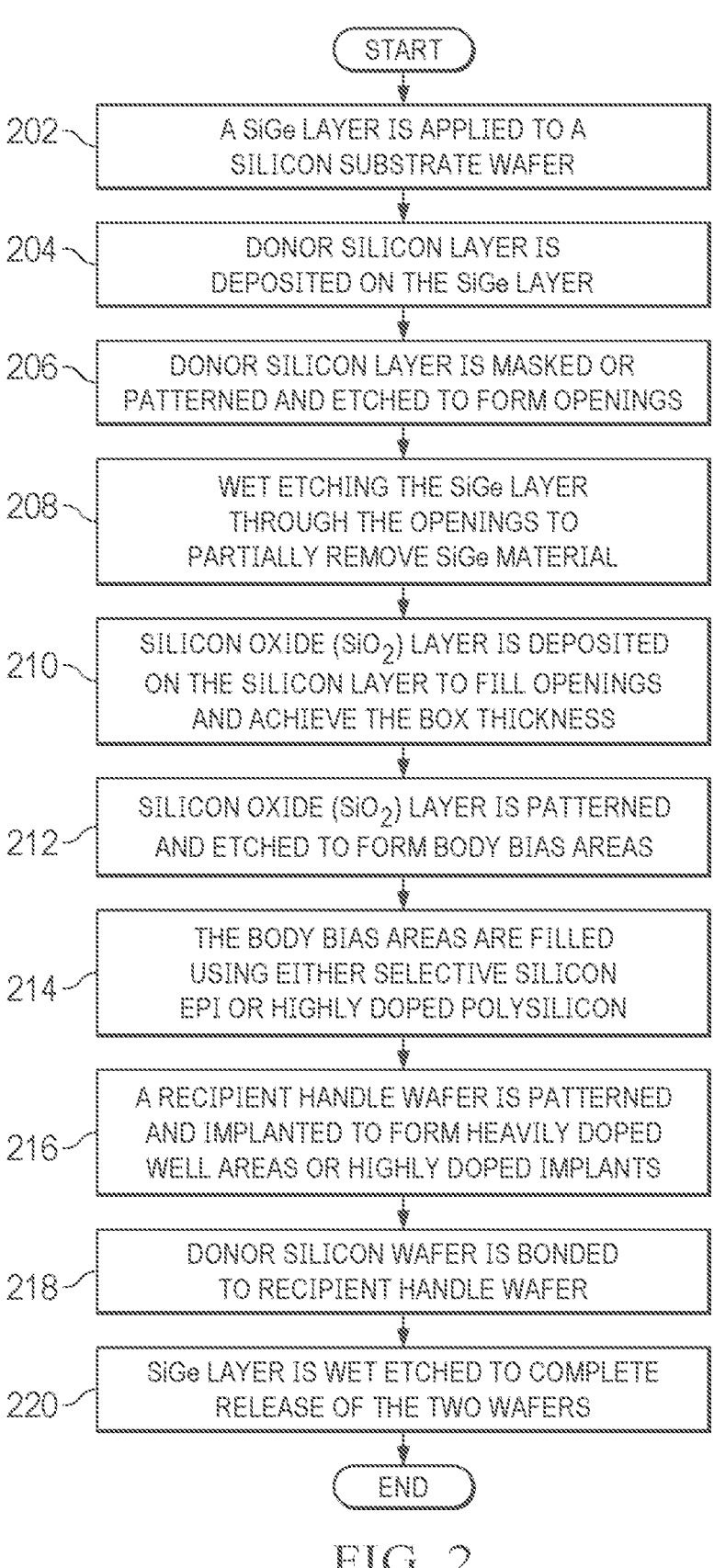

START

202 — A SiGe LAYER IS APPLIED TO A SILICON SUBSTRATE WAFER

204 — DONOR SILICON LAYER IS DEPOSITED ON THE SiGe LAYER

206 — DONOR SILICON LAYER IS MASKED OR PATTERNED AND ETCHED TO FORM OPENINGS

208 — WET ETCHING THE SiGe LAYER THROUGH THE OPENINGS TO PARTIALLY REMOVE SiGe MATERIAL

210 — SILICON OXIDE ($SiO_2$) LAYER IS DEPOSITED ON THE SILICON LAYER TO FILL OPENINGS AND ACHIEVE THE BOX THICKNESS

212 — SILICON OXIDE ($SiO_2$) LAYER IS PATTERNED AND ETCHED TO FORM BODY BIAS AREAS

214 — THE BODY BIAS AREAS ARE FILLED USING EITHER SELECTIVE SILICON EPI OR HIGHLY DOPED POLYSILICON

216 — A RECIPIENT HANDLE WAFER IS PATTERNED AND IMPLANTED TO FORM HEAVILY DOPED WELL AREAS OR HIGHLY DOPED IMPLANTS

218 — DONOR SILICON WAFER IS BONDED TO RECIPIENT HANDLE WAFER

220 — SiGe LAYER IS WET ETCHED TO COMPLETE RELEASE OF THE TWO WAFERS

END

FIG. 2

DEVICE AND METHOD FOR FABRICATING A PATTERNED FD-SOI WAFER INCLUDING EXPOSED BURIED OXIDE

RELATED PATENT APPLICATION

This application claims priority to commonly owned U.S. Application No. 63/426,657, filed Nov. 18, 2022, the entire contents of which are hereby incorporated by reference for all purposes.

TECHNICAL FIELD

The present disclosure relates to fully depleted silicon-on-insulator (FD-SOI) wafer production, in particular, production of patterned FD-SOI wafers from standard silicon starting sub state wafers.

BACKGROUND

Fully depleted silicon-on-insulator (FD-SOI) wafers are also known as ultra-thin or extremely thin silicon-on-insulator (ET-SOI) wafers. Generally, FD-SOI wafers are procured from a substrate manufacturer and then the buried oxide layer (BOX) is patterned and epitaxially grown. This is very costly. Patterned FD-SOI wafers are expensive due to the total process cost, including the cost of the FD-SOI substrates and additional costs associated with etching the patterned buried oxide layer (BOX) areas and regrowing body bias areas by epitaxial (EPI) growth.

Traditional methods for creating the FD-SOI wafer result in a continuous buried oxide layer (BOX) and device silicon layer that must be patterned to allow for a top side contact to the body. For example, FD-SOI wafers have a top layer of silicon, so the buried oxide layer (BOX) is unexposed. The buried oxide layer (BOX) should be open or exposed for body biasing. To open or expose the ultra-thin buried oxide (BOX) areas for substrate contacts, the wafers undergo further processing, such as etching. The costs associated with further processing to expose the ultra-thin buried oxide (BOX) areas make the FD-SOI expensive.

There is a need for a reduced cost and simplified patterned FD-SOI wafer process that produces FD-SOI wafers with exposed buried oxide layer (BOX) for substrate contacts.

SUMMARY OF THE INVENTION

Aspects provide methods for production of patterned FD-SOI wafers from standard silicon starting substrate wafers, wherein the methods utilize selective Si/SiGe wet etch chemistries and dual use STI/Release hole patterns to create a pre-patterned FD-SOI wafer.

An aspect provides a method comprising: preparing a donor silicon wafer comprising: applying a sacrificial SiGe layer on a silicon substrate wafer; depositing a donor silicon layer on the SiGe layer; etching the donor silicon layer to form at least one opening in the silicon layer; wet etching the sacrificial SiGe layer through the at least one opening in the silicon layer to partially remove SiGe material from the sacrificial SiGe layer and preserve the donor silicon layer; depositing an $SiO_2$ layer on the donor silicon layer; etching the $SiO_2$ layer to form at least one body bias area; and depositing silicon, or polysilicon, in the at least one body bias area; bonding a recipient handle wafer to the etched $SiO_2$ layer of the donor silicon wafer; and wet etching the sacrificial SiGe layer to release the donor silicon wafer from the recipient handle wafer, whereby the $SiO_2$ layer and the donor silicon layer remain bonded to the recipient handle wafer to form a fully depleted silicon-on-insulator (FD-SOI) wafer, wherein the $SiO_2$ layer is a buried oxide layer.

According to a further aspect, there is provided a device by a method, the device comprising: a fully depleted silicon-on-insulator (FD-SOI) wafer comprising: a silicon substrate; a $SiO_2$ layer on the silicon substrate, wherein the $SiO_2$ layer has at least one body bias area; a silicon layer on the $SiO_2$ layer, wherein the silicon layer has at least one opening through which the $SiO_2$ layer is exposed, wherein the device is made by a method comprising: preparing a donor silicon wafer comprising: applying a sacrificial SiGe layer on a silicon substrate wafer; depositing a donor silicon layer on the SiGe layer; etching the donor silicon layer to form at least one opening in the silicon layer; wet etching the sacrificial SiGe layer through the at least one opening in the silicon layer to partially remove SiGe material from the sacrificial SiGe layer and preserve the donor silicon layer; depositing an $SiO_2$ layer on the donor silicon layer; etching the $SiO_2$ layer to form at least one body bias area; and depositing silicon, or polysilicon, in the at least one body bias area; bonding a recipient handle wafer to the etched $SiO_2$ layer of the donor silicon wafer; and wet etching the sacrificial SiGe layer to release the donor silicon wafer from the recipient handle wafer, whereby the $SiO_2$ layer and the donor silicon layer remain bonded to the recipient handle wafer to form a fully depleted silicon-on-insulator (FD-SOI) wafer.

Another aspect provides a device by a method, the device comprising: a fully depleted silicon-on-insulator (FD-SOI) wafer comprising: a silicon substrate comprising a doped implant; a silicon layer having a plurality of openings arranged in a first predetermined pattern; and a $SiO_2$ layer between the silicon substrate and the silicon layer, wherein the $SiO_2$ layer has a plurality of body bias areas arranged in a second predetermined pattern, whereby the $SiO_2$ layer is exposed via the plurality of openings, wherein the device is made by a method comprising: preparing a donor silicon wafer comprising: applying a sacrificial SiGe layer on a silicon substrate wafer; depositing a donor silicon layer on the SiGe layer; etching the donor silicon layer to form at least one opening in the silicon layer; wet etching the sacrificial SiGe layer through the at least one opening in the silicon layer to partially remove SiGe material from the sacrificial SiGe layer and preserve the donor silicon layer; depositing an $SiO_2$ layer on the donor silicon layer; etching the $SiO_2$ layer to form at least one body bias area; and depositing silicon, or polysilicon, in the at least one body bias area; bonding a recipient handle wafer to the etched $SiO_2$ layer of the donor silicon wafer; and wet etching the sacrificial SiGe layer to release the donor silicon wafer from the recipient handle wafer, whereby the $SiO_2$ layer and the donor silicon layer remain bonded to the recipient handle wafer to form a fully depleted silicon-on-insulator (FD-SOI) wafer.

BRIEF DESCRIPTION OF THE DRAWINGS

The figures illustrate aspects of FD-SOI wafer devices with exposed buried oxide layers (BOX) for substrate contacts and methods for production of patterned FD-SOI wafers from standard silicon starting substrate wafers, wherein the methods utilize selective Si/SiGe wet etch chemistries and dual use STI/Release hole patterns to create a pre-patterned FD-SOI wafer.

FIG. 1I shows a cross-sectional, side view of the bonded wafers shown in FIG. 1H, wherein the SiGe layer has been wet etched to release the donor silicon wafer from the recipient handle wafer.

FIG. 2 shows a flow chart of a method for manufacturing an FD-SOI wafer.

The reference number for any illustrated element that appears in multiple different figures has the same meaning across the multiple figures, and the mention or discussion herein of any illustrated element in the context of any particular figure also applies to each other figure, if any, in which that same illustrated element is shown.

DESCRIPTION

Methods for production of patterned FD-SOI wafers from standard silicon starting substrate wafers utilize selective Si/SiGe wet etch chemistries and dual use (shallow trench isolation) STI/Release hole patterns to create a patterned FD-SOI wafer are described herein. The methods may utilize commonly available silicon processing tools to create a patterned FD-SOI wafer with dual use release etch/STI areas and substrate contact areas from a standard silicon starting substrate. No specialty implanter is required in the process. No wafer split tool is required in the process. Methods may use only one new raw silicon wafer per cycle, so that the process is less expensive than patterning and etching FD-SOI wafers to expose the buried oxide (BOX) layer. The methods may produce a fully depleted silicon-on-insulator (FD-SOI) wafer comprising: a silicon substrate; a buried oxide layer on the silicon substrate, wherein the buried oxide layer has at least one body bias area; and a silicon layer on the buried oxide layer, wherein the silicon layer has at least one opening through which the buried oxide layer is exposed.

The FD-SOI process may not require doping the channel. The behavior of the transistors may be controlled by the gate and may also be controlled by the body bias. The FD-SOI process may create body bias areas during the buried oxide layer (BOX) and device layer formation, using a standard starting silicon substrate and commonly available semiconductor processing tools.

Figures 1A, 1B, 1C:
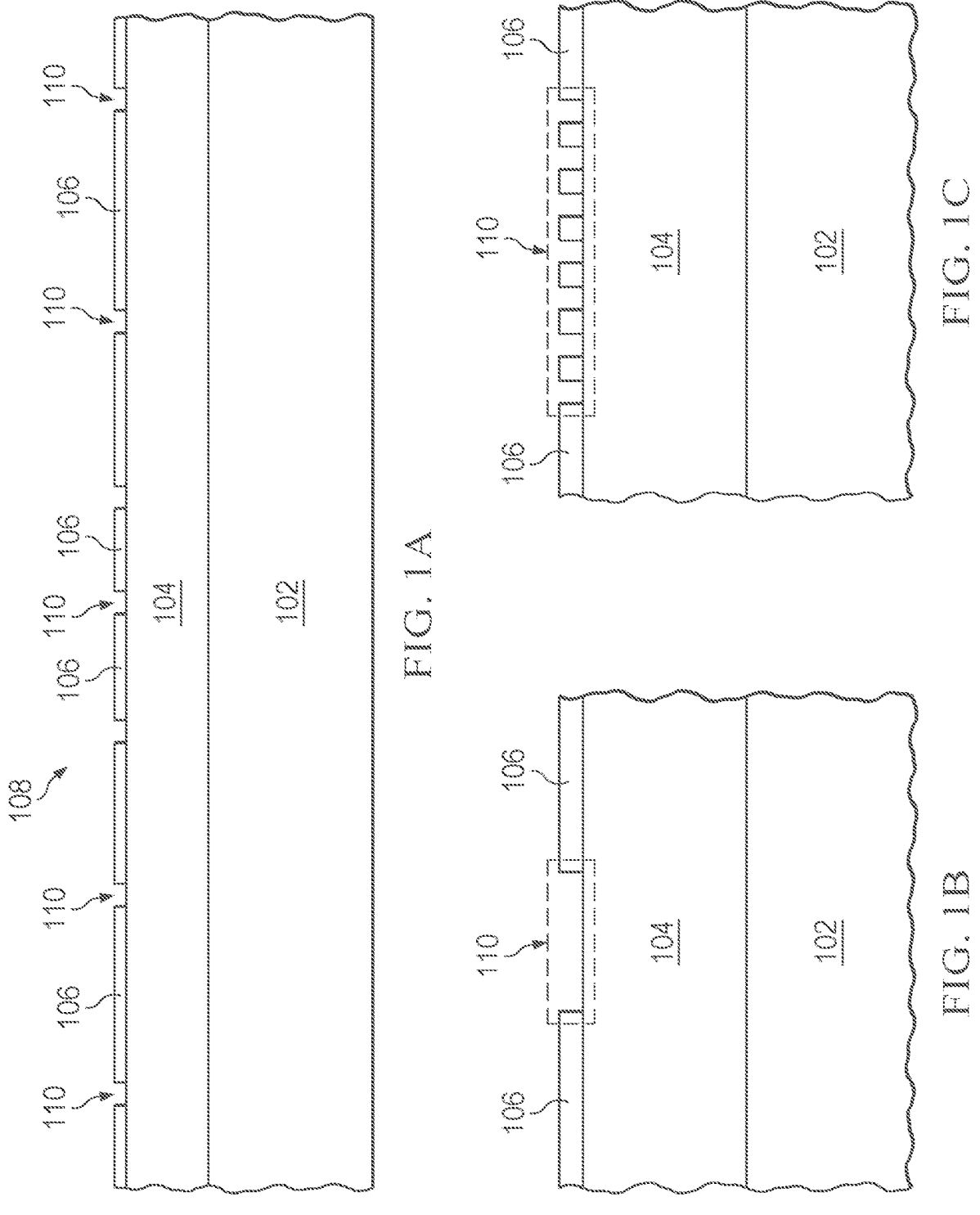
FIG. 1A shows a cross-sectional, side view of a silicon substrate, with a sacrificial SiGe layer and a donor silicon layer.
FIG. 1B shows an expanded cross-sectional, side view of a first example of an opening in the donor silicon layer shown in FIG. 1A.
FIG. 1C shows an expanded cross-sectional, side view of a second example of an opening in the donor silicon layer shown in FIG. 1A.

FIG. 1A shows a cross-sectional, side view of a raw standard starting wafer in the form of a silicon substrate 102. A sacrificial silicon-germanium (SiGe) layer 104 has been epitaxially grown or deposited on the silicon substrate 102. A donor silicon layer 106 has been epitaxially grown, or deposited, on the sacrificial SiGe layer 104 to create the donor silicon wafer 108. The donor silicon layer 106 has been patterned with a shallow trench isolation (STI) mask and photo etched to make openings 110 in the donor silicon layer 106. An STI mask is a specific mask layer that may be used for isolation between devices. An STI mask may have a dual purpose wherein it defines the areas that will eventually have isolation oxide, the areas known as STI areas, and also provides openings 110 for an initial or first release etch. The etching of the donor silicon layer 106 may form a plurality of openings 110 in the donor silicon layer 106 in a first predetermined pattern. STI, also known as the box isolation technique, is an integrated circuit feature that prevents electric current leakage between adjacent semiconductor device components. STI is generally used on CMOS process technology nodes of 250 nanometers and smaller. As used herein, STI areas go down to the $SiO_2$ layer (see FIG. 1J). An additional mask may provide deeper trenches not on buried oxide for higher voltage silicon CMOS, e.g., for bipolar-CMOS-DMOS (BCD), such that flash or precision-analog that patterned FD-SOI offer a few bulk CMOS zones. The bulk CMOS zones may provide much deeper (>>2000 deeper) trench with a different mask. In one aspect, there may be a shallow trench and a deeper trench. In some aspects, the final FD-SOI integrated circuit wafers may have many CMOS zones, but they may not have as many buried oxide layers (BOXs) therein. Deeper trenches may be made in the bulk CMOS zones where there is no BOX. Etching through just silicon in the bulk CMOS zones may be simpler than etching through the device silicon, a $SiO_2$ layer, and then into the handle wafer.

FIG. 1B shows a first example of an enlarged cross-sectional, side view of an opening 110 in the donor silicon layer 106 shown in FIG. 1A. The thickness of the sacrificial SiGe layer 104 relative to the size of the opening 110 in the donor silicon layer 106 may influence the amount of SiGe dissolved away in a later wet etch described below. Large openings 110 (STI regions) may subsequently be at least partially filled so that a subsequent oxide deposition for filling these openings 110 (areas opened up using the STI mask) may not form a continuous bridge to the bottom of the wet etch regions. The size of the opening 110 may influence the initial wet etch. If the opening 110 is too big, the initial wet etch of the SiGe may completely remove the SiGe layer 104 and then the subsequent oxide deposition will be continuous from the donor silicon layer 106 to the silicon substrate 102. If a $SiO_2$ layer 112 bridges (see FIG. 1E), then a second SiGe wet etch may not release the donor silicon layer 106 from the silicon substrate 102. See FIG. 1I. A large open area may not pinch off the subsequent non-conformal oxide deposition, the entire area of SiGe under this large open area may be removed, and the subsequent oxide deposition may be filled to the bottom of the wet etch hole. This may keep the wafer from separating during the second SiGe wet etch. In one aspect, the diameter of an opening 110 is 50% of the thickness of the SiGe layer 104, which may inhibit bridging.

FIG. 1C shows a second example of an enlarged cross-sectional, side view of an opening 110 in the donor silicon layer 106 shown in FIG. 1A. If a relatively larger isolation area is desired, it may be created by having many small openings next to each other by adding dummy fill, as shown in FIG. 1C. As illustrated, this opening 110 comprises an array of smaller openings. A plurality of dummy fill opening s110 and may be utilized to slow a wet etch process so as to dissolve away less of the SiGe layer 104 compared to one relatively larger opening 110 shown in FIG. 1B. If an isolation area larger than 50% of the thickness of the SiGe layer 112 is desired, dummy fill may be added (see FIG. 1C) to inhibit the initial wet etch from going through the entire thickness of the SiGe layer 104 and also may pinch off the oxide deposition to inhibit bridging to the silicone substrate 102. A dummy fill is a pattern that is not electrically active and is placed to make the pattern more dense because non-uniformities may occur in large areas with no pattern, e.g., areas that may be etched when the dummy fill is applied in an area. A dummy fill may be added in a large open area to effectively make the large open area into an array of smaller open areas that will process more uniformly. Adding the dummy fill may inhibit the first SiGe wet etch from etching through the entire film thickness and also may allow the subsequent non-conformal oxide deposited to not continuously fill the open area, connecting the device silicon to the handle wafer. A large open area patterned into the device silicon layer may create a wet etch hole that etches all of the way down through the SiGe layer 104 during the first wet etch. When the $SiO_2$ material is deposited, it may then then be conformal and tie the silicon substrate 102 to the donor silicon layer 106, which may prevent separation during the second wet etch of the SiGe layer 104 because it won't be SiGe material connecting the two layers, it will be the $SiO_2$ material forming a bridge. To reduce the likelihood of $SiO_2$ bridges, large areas may have dummy fill added. Dummy fill can be automatically added to masks based on a given set of rules. This is routinely done for metal layers. Adding the dummy fill routine at the STI layer may add a pattern into large open areas and make them an array of small open areas, instead of one large open area.

Figures 1D, 1E:
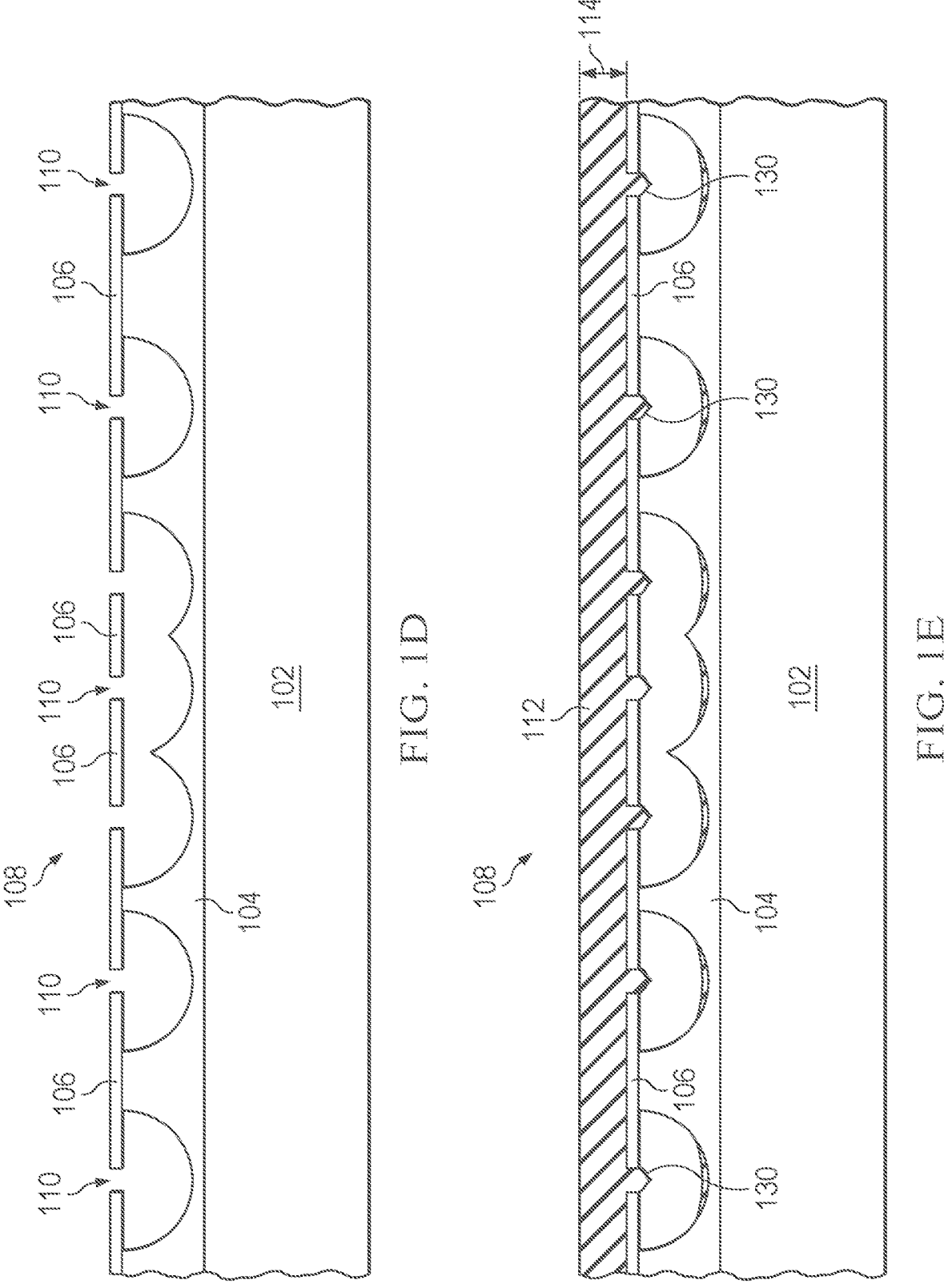
FIG. 1D shows a cross-sectional, side view of the wafer shown in FIG. 1A, wherein the wafer has undergone a partial selective wet etch of the SiGe layer while the donor silicon layer is preserved.
FIG. 1E shows a cross-sectional, side view of the wafer shown in FIG. 1D, wherein a layer of $SiO_2$ has been added by a non-conformal oxide deposition.

FIG. 1D shows a cross-sectional, side view of the donor silicon wafer 108 shown in FIG. 1A, wherein the wafer has undergone a partial selective wet etch of the sacrificial SiGe layer 104 while the donor silicon layer 106 has been preserved. Where the pattern of the openings 110 allows more wet etchant to penetrate into the SiGe layer 104, as described in relation to FIGS. 1B and 1C, there may be more removal of the sacrificial SiGe layer 104. A portion of the sacrificial SiGe layer 104 remains to support the donor silicon layer 106, but enough of the sacrificial SiGe layer is removed to allow later splitting of the donor silicon layer 106 from the starting silicon substrate 102. A release may be accomplished via a single etch from the perimeter, without an initial etch through openings 110 in the donor silicon layer 106. However, a single perimeter etch would take longer than a practical time period because the etchant would only be able to enter from the edges at the perimeter of the wafer and it would take an extremely long time to etch all of the way to the center of the wafer, especially on a 300 mm wafer. In some aspects, about one half of the SiGe layer 104 may be removed by a first etch through openings in the donor silicon layer 106 (see FIG. 1D) and then enough of the remaining SiGe layer 104 may be removed by a second etch from the wafer perimeter to release the donor silicon layer 106. See FIG. 1I. If an opening 110 is relatively large or a plurality of openings 110 are spaced close together, a time period of the first wet etch may be shortened to reduce the amount of the SiGe layer 104 etched away so that a sufficient amount of the SiGe layer 104 remains to support the donor silicon layer 106. If an opening 110 is relatively small or a plurality of openings 110 are spaced far apart, a time period of the first wet etch may be lengthened to increase the amount of the SiGe layer 104 etched away so that enough of the SiGe layer 104 is etched away so that the second wet etch from the perimeter of the wafer may remove remnant of the SiGe layer 104 to achieve separation in a reasonable time period. Where dummy fill may create an array of smaller open areas, the wet etch time of the first wet etch of the SiGe layer 104 may be longer without significantly increasing a risk of etching all of the way through the SiGe layer 104.

FIG. 1E shows a cross-sectional, side view of the donor silicon wafer 108 shown in FIG. 1D, wherein an $SiO_2$ layer 112 has been added by a non-conformal oxide deposition. As the $SiO_2$ layer 112 is deposited, $SiO_2$ may pass through the openings 110 in the donor silicon layer 106. If too much $SiO_2$ passes through an opening 110 in the donor silicon layer 106, it may form a bridge from the starting silicon substrate wafer 102 to the donor silicon layer 106. Bridges between the starting silicon substrate 102 and the donor silicon layer 106 may make it more difficult to release the donor silicon layer 106 from the starting silicon substrate wafer in a later splitting process. Thus, one aspect of the process is to deposit the $SiO_2$ layer 112 so that $SiO_2$ is deposited in and through the openings 110 in the donor silicon layer 106 to form exposure plugs 130, but not so that the $SiO_2$ bridges with the starting silicon substrate 102. A $SiO_2$ deposition process that is non-conformal has a characteristic referred to as "bread loafing," which enhances the deposition rate on the corners of a feature being deposited upon. "Bread loafing" may cause openings 110 to close up after a certain amount of oxide is deposited so that an $SiO_2$ exposure plug 130 (see FIG. 1E) is formed in each opening 110 (see FIG. 1D) in the donor silicon layer 106. In some aspects, it may be desirable to keep the openings 110 small enough so that they close up during $SiO_2$ deposition to inhibit areas where the oxide bridges from the donor silicon layer 106 and the silicone substrate 102. After the $SiO_2$ layer 112 is added by non-conformal oxide deposition, the $SiO_2$ layer 112 may then undergo a polishing process or a chemical mechanical polishing (CMP) process to planarize the $SiO_2$ layer 112 to a desired buried oxide (BOX) layer thickness 114.

Figure 1F:
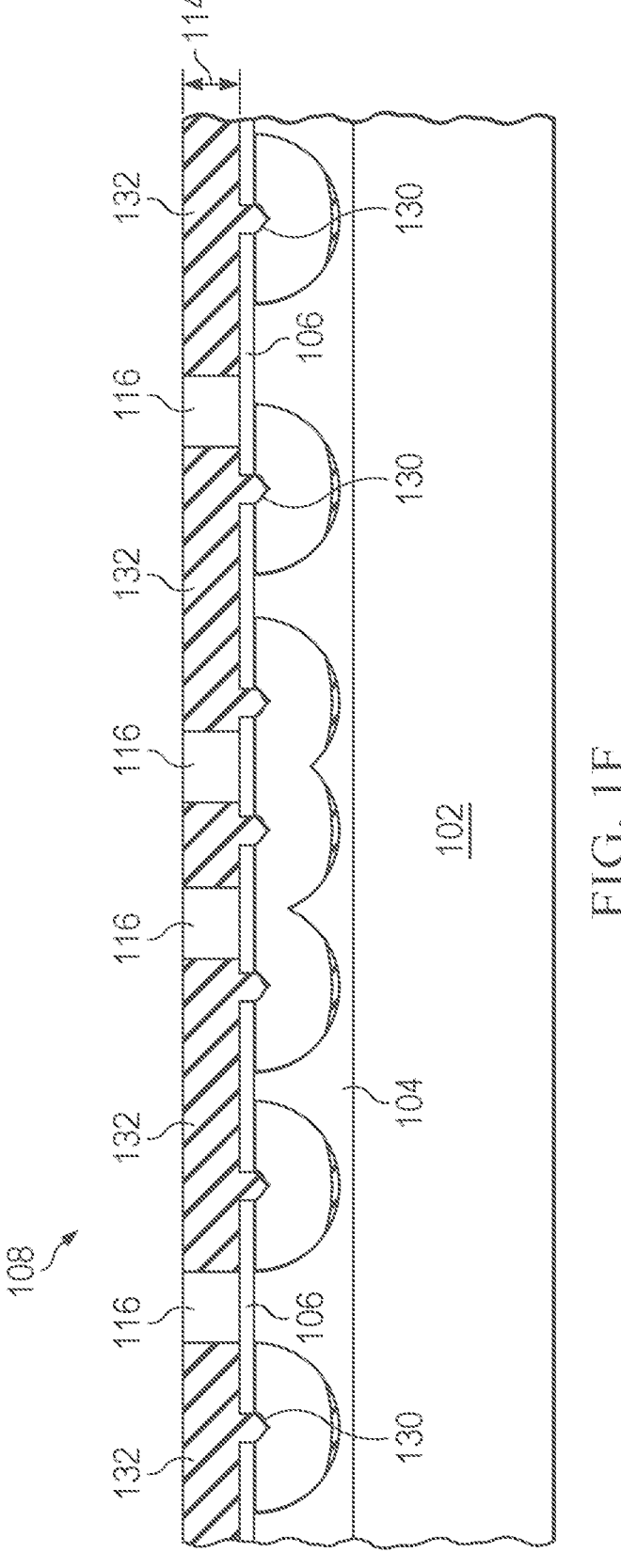
FIG. 1F shows a cross-sectional, side view of the wafer shown in FIG. 1E, wherein body bias areas have been created.

FIG. 1F shows a cross-sectional, side view of the donor silicon wafer 108 shown in FIG. 1E, wherein body bias areas 116 have been created. Body bias areas 116 may be formed by selective epitaxial (EPI) growth, or deposition, or doped polysilicon. In particular, in one example the body bias areas 116 may be patterned and the $SiO_2$ layer 112 (see FIG. 1E) may be etched to remove the $SiO_2$ material from the body bias areas 116. Silicon may then be formed in the etched body bias areas 116 by EPI growth, whereby the $SiO_2$ layer 112 is made to have BOXs 132 separated by the body bias areas 116. The etching of the $SiO_2$ layer 112 to form body bias area 116 may include etching the $SiO_2$ layer 112 to form a plurality of body bias areas 116 in a second predetermined pattern. Alternatively, doped polysilicon may be formed in the etch body bias areas 116 by deposition. The BOXs 132 with the body bias areas 116 formed between may then be planarized by polishing or chemical mechanical polishing (CMP), wherein a desired buried oxide (BOX) layer thickness 114 may be obtained by CMP.

Figure 1G:
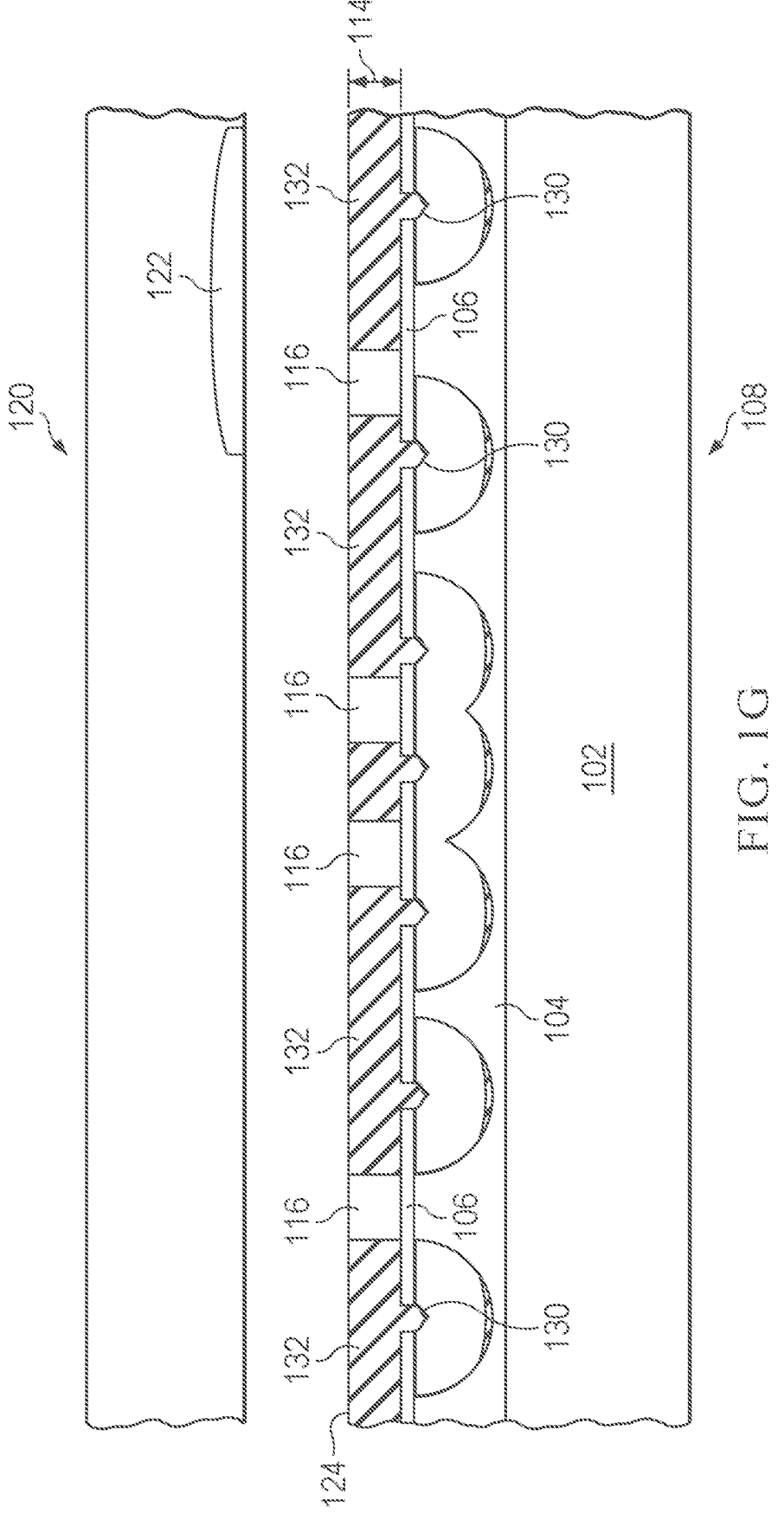
FIG. 1G shows a cross-sectional, side view of the donor silicon wafer shown in FIG. 1F, wherein a recipient handle wafer is positioned for bonding to the donor silicon wafer.

FIG. 1G shows a cross-sectional, side view of the donor silicon wafer 108 shown in FIG. 1F, wherein a recipient handle wafer 120 is positioned for bonding to the side of the donor silicon wafer 108 having the BOXs 132 with the body bias areas 116 formed between, i.e., to the top side 124. The recipient handle wafer 120 may be prepared to include a highly doped implant 122. In particular, a well area on the recipient handle wafer may be patterned and highly doped to form the highly doped implant 122. In some aspects, the recipient handle wafer 120 may be highly doped as deposited, or it may be subsequently highly doped, by ion implantation, so that electrical contact may be made to the recipient handle wafer 120. The amount of doping considered highly doped may vary based on the resistance that may be tolerated, for example about 20 mOhm-cm. A current path from the body bias area 116 (see FIG. 1F) to the highly doped implant 122 (see FIG. 1G) may be created, which may allow control of the voltage under the BOX 132 from the top side 138 of the recipient handle wafer 120. See FIG. 1J. This current path may be useful for FDSOI transistors that may be built in the device silicon above the BOX 132.

The recipient handle wafer 120 may be planarized in preparation for bonding with the donor silicon wafer 108.

Figure 1H:
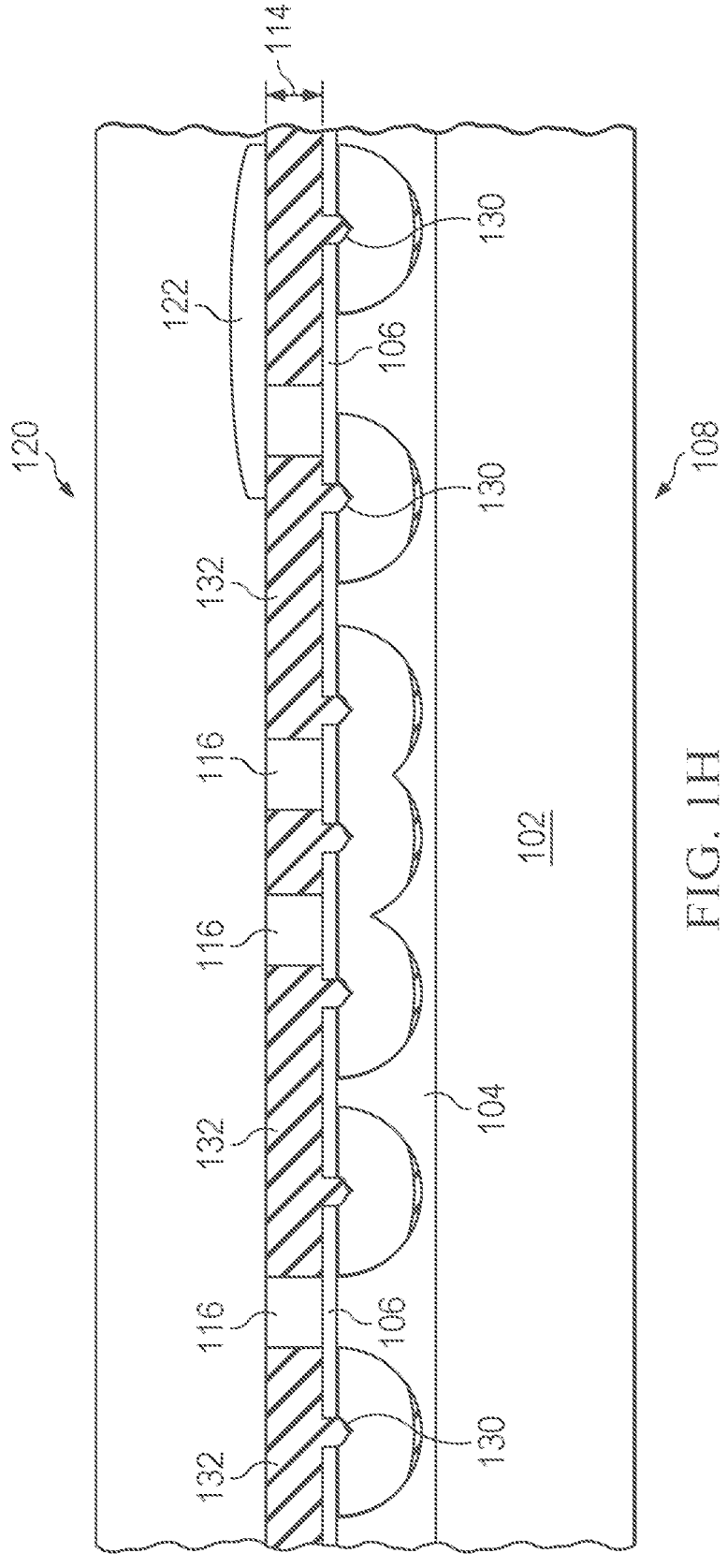
FIG. 1H shows a cross-sectional, side view of the wafers shown in FIG. 1G, wherein the recipient handle wafer has been bonded to the donor silicon wafer.
Figure 11:
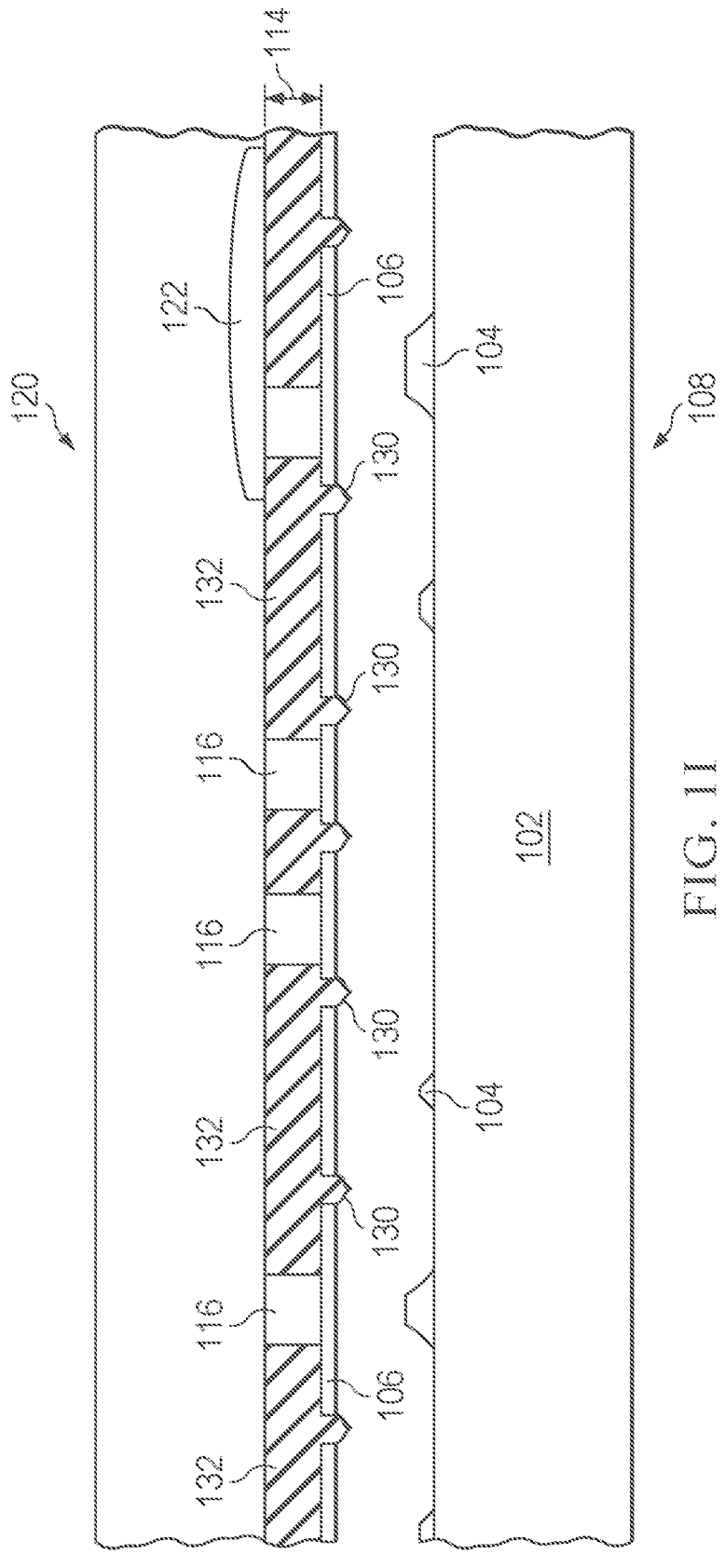

FIG. 1H shows a cross-sectional, side view of the donor silicon wafer 108 and recipient handle wafer 120 shown in FIG. 1G, wherein the recipient handle wafer 120 has been bonded to the donor silicon wafer 108. In particular, the silicon recipient handle wafer 120 is bonded to the combined body bias areas 116 and the SiO$_2$ layer 112 of the donor silicon wafer 108.

FIG. 1I shows a cross-sectional, side view of the donor silicon wafer 108 and recipient handle wafer 120 shown in FIG. 1H, wherein the sacrificial SiGe layer 104 is again wet etched. The first wet etch is shown in FIG. 1D. This second wet etch allows etchant to flow from the perimeter of the wafer toward the center of the wafer to remove enough of the SiGe layer 104 to release the starting silicon substrate 102 from the donor silicon layer 106, which is now part of the recipient handle wafer 120. The wet etch may be injected between the wafers 108 and 120 from the sides at the perimeter and may propagate through the entire sacrificial SiGe layer 104 because the sacrificial SiGe layer 104 has already had much of the SiGe material removed by the prior etching described with reference to FIG. 1D. This selective wet etch of the sacrificial SiGe layer 104 preserves the SiO$_2$ material of the BOXs 132 comprising the exposure plugs 130 filling the openings 110 of the donor silicon layer 106, and allows the recipient handle wafer 120 to be released from the silicon substrate 102 of the donor silicon wafer 108.

The donor silicon wafer 108 may thereafter be polished or chemical mechanical polished (CMP) to remove any remaining portions of sacrificial SiGe layer 104 so that it may be used as a recipient handle wafer 120 in a next production cycle.

Figure 1J:
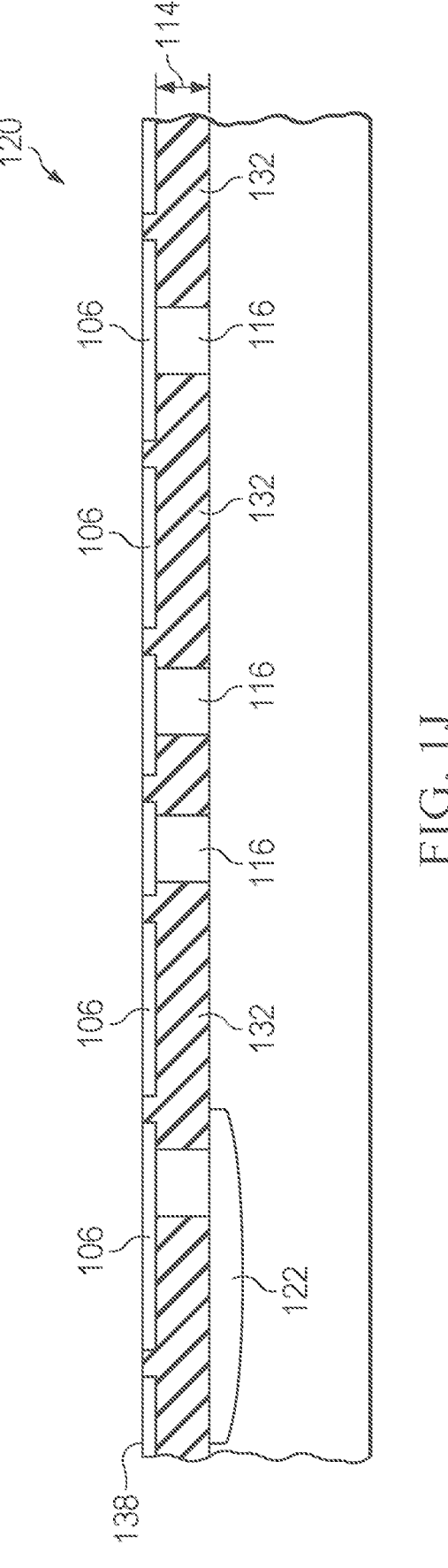
FIG. 1J shows a cross-sectional, side view of a complete recipient handle wafer shown in FIG. 1I, wherein the recipient handle wafer is turned upside down so the buried oxide layer (BOX) and body bias areas are at the top surface.

FIG. 1J shows a cross-sectional, side view of the recipient handle wafer 120 shown in FIG. 1I, wherein the recipient handle wafer 120 is turned upside-down so BOXs 132 and body bias areas 116 are at the top side 138, as shown. The recipient handle wafer 120 may be polished or chemical mechanical polished (CMP) to planarize the finalized, patterned FD-SOI wafer.

FIG. 2 shows a method for manufacturing an FD-SOI wafer. According to the method, an SiGe layer 104 may be applied 202 to a silicon substrate 102 by epitaxial growth to a thickness approximately ten times (10x) the thickness of the silicon substrate 102. The SiGe layer 104 may be a sacrificial layer. A donor silicon layer 108 may be deposited 2204 on the SiGe layer 104. The donor silicon layer 108 may be masked or patterned and etched 206 to form openings 110. See FIG. 1A. Regarding epitaxial growth of SiGe layer 104 on silicon substrate 102, the donor silicon layer 106 may be patterned with a dual use release etch/STI pattern, wherein the first use provides openings 110 through the donor silicon layer 106 to do the first etch of the SiGe layer 104 (see FIG. 1D) and the second use fills the openings 110 with SiO$_2$ to form exposure plugs 130 to act as the STI areas to isolate between the devices. See FIG. 1E. The pattern used for shallow trench isolation (STI), which is subsequently filled with oxide, is dual use because that pattern is initially used to facilitate the first partial release etch of the SiGe layer 104. Large pattern openings 110 (STI regions) may be at least partially filled with dummy fill material so that subsequent oxide deposition for filling these openings may not form a continuous bridge to the bottom of the wet etch regions. The SiGe layer is wet etched 408 through the openings in the donor silicon layer 106 to partially remove SiGe material from the SiGe layer 104 and preserve the donor silicon layer 106. This wet etch 408 may etch more than 50% of the SiGe, which wet etch 408 is selective to silicon because it etches SiGe at a much higher rate than Si. See FIG. 1D. A silicon oxide (SiO$_2$) layer 112 may be deposited 210 on the donor silicon layer to fill openings 110 and achieve a preselected buried oxide (BOX) layer thickness 114, but the oxide may not be conformal or bridge to the bottom of the wet etched areas. By controlling the size of the openings 110 and the duration of the wet etch, a desired amount of the SiGe layer 104 may be removed. The depositing 210 of a SiO$_2$ layer may have a preselected layer thickness corresponding to the preselected buried oxide (BOX) layer thickness 114. See FIG. 1E. The silicon oxide (SiO$_2$) layer 112 may be patterned and etched 212 to form body bias areas 116. The body bias areas 116 may be filled 214 using either selective silicon EPI or highly doped polysilicon, followed by polishing or chemical mechanical polishing (CMP) of the donor silicon wafer 108. See FIG. 1F. The selective silicon EPI may also be doped (see the highly doped implant 122 in FIG. 1G) to provide an electrical path from the top side 138 of the recipient handle wafer 120 to the silicon below the BOX 132 so there is good electrical connection from body bias areas 116 through the highly doped implant 122 under the gate. A recipient handle wafer 120 may be patterned and implanted 216 to form highly doped well areas or highly doped implants 122. See FIG. 1G. The donor silicon wafer 108 may be bonded 218 to recipient handle wafer 120. See FIG. 1H. The SiGe layer may be wet etched 220 from the side to complete release of the two wafers. See FIG. 1I. The recipient handle wafer 120 (now the patterned FD-SOI wafer) may go through a polishing process or a chemical mechanical polishing (CMP) process to planarize portions of the SiO$_2$ layer 112 forming the exposure plugs 130 extending through the openings 110 of the STI regions so the exposure plugs 130 are even with the device silicon. Compare FIGS. 1I and 1J. The method produces a fully depleted silicon-on-insulator (FD-SOI) wafer having a BOX 132 of a desired thickness 114. See FIG. 1J. The donor silicon wafer 108 (see FIG. 1I) can become a recipient handle wafer 120 (see FIG. 1G) in the next process cycle.

Figure 3:
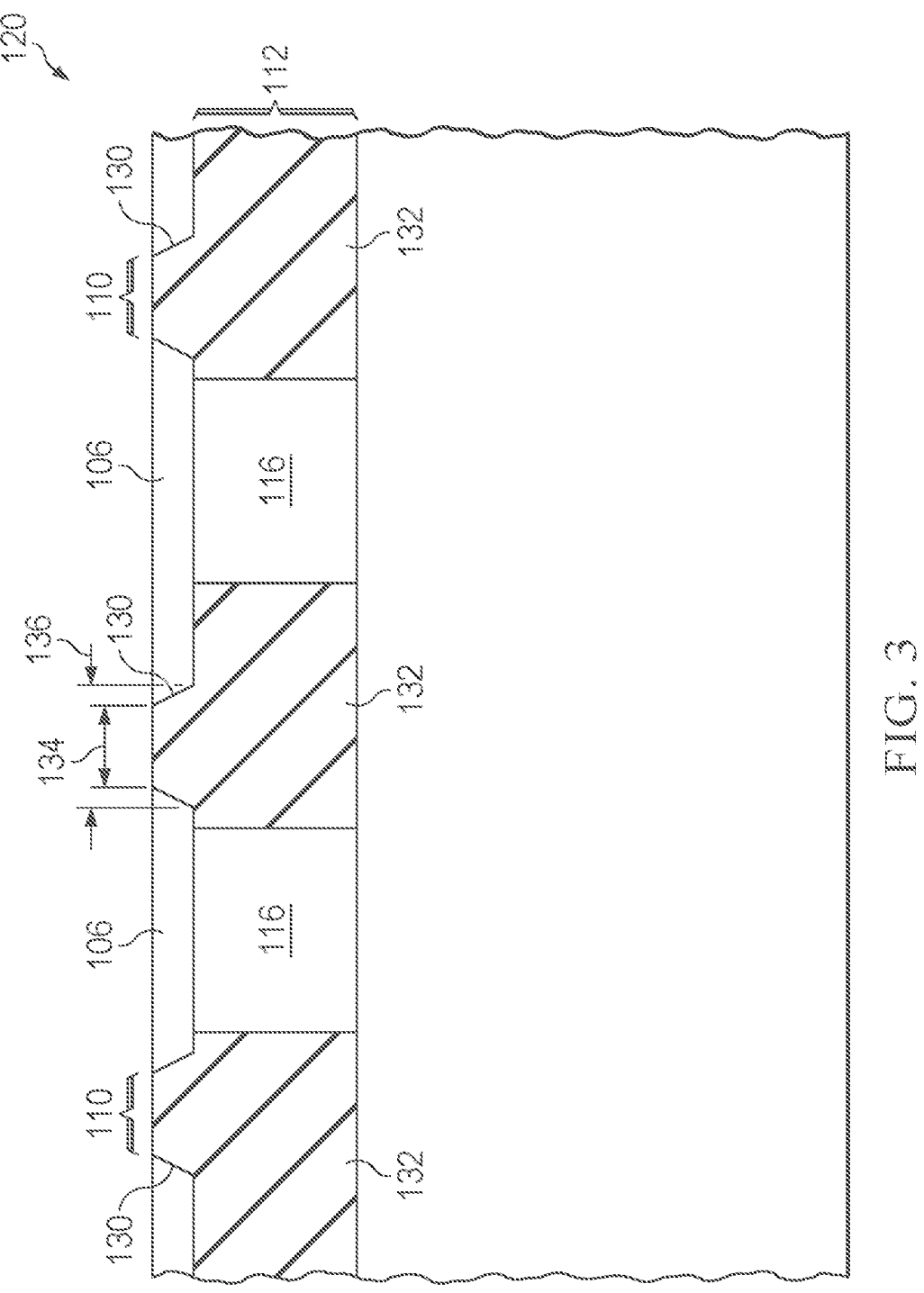
FIG. 3 is an enlarged cross-sectional side view of a portion of the recipient handle wafer 120 shown in FIG. 1J.

FIG. 3 is an enlarged cross-sectional side view of a portion of the recipient handle wafer 120 shown in FIG. 1J. The recipient handle wafer 120 has a silicon substrate 102, a SiO$_2$ layer 112, and a donor silicon layer 106. The SiO$_2$ layer 112 has several BOXs 132 separated by body bias areas 116. The donor silicon layer 106 has openings 110 filled with exposure plugs 130. When the STI areas are etched to form openings 110 in the silicon donor layer 106, there is a slight taper of the silicon sidewalls. The top of the opening is a little wider than the bottom. Because the openings 110 are formed early in the process and recipient handle wafer 120 is flipped, the wider portion of the opening 110 is on the bottom, as shown in FIG. 3. Thus, the exposure plugs 130 have a box dimension 136 larger than an exposure dimension 134. The box dimension 136 of the exposure plug 130 is near a proximal end where the exposure plug 130 joins with the BOX 132 and the exposure dimension 134 is near a distal end of the exposure plug 132, as shown in FIG. 3. The exposure plugs 130 have a trapezoidal-shaped cross-section in the plane of the view shown in FIG. 3.

Although examples have been described above, other variations and examples may be made from this disclosure without departing from the spirit and scope of these disclosed examples.

The invention claimed is:

1. A device comprising:
a fully depleted silicon-on-insulator (FD-SOI) wafer comprising:
a silicon substrate;
a $SiO_2$ layer on the silicon substrate, wherein the $SiO_2$ layer includes buried oxide (BOX) regions separated by body bias areas in the $SiO_2$ layer, the body bias areas comprising silicon or polysilicon; and
a silicon layer on the $SiO_2$ layer, wherein the silicon layer covers the body bias areas in the $SiO_2$, and wherein respective BOX regions include a main portion and an exposure plug extending from the main portion and exposed through a respective opening in the silicon layer, wherein a respective exposure plug has a box dimension larger than an exposure dimension, wherein the box dimension is near a proximal end connecting with the main portion of the respective BOX region and the exposure dimension is near a distal end of the respective exposure plug.

2. The device as claimed in claim 1, wherein the FD-SOI wafer comprises a doped implant in the silicon substrate.

3. The device as claimed in claim 1, wherein the respective exposure plug has a trapezoidal-shaped cross-section.

4. A device by a method, the device comprising:
a fully depleted silicon-on-insulator (FD-SOI) wafer comprising:
a silicon substrate comprising a doped implant;
a silicon layer having a plurality of openings arranged in a first predetermined pattern; and
a $SiO_2$ layer between the silicon substrate and the silicon layer, wherein the $SiO_2$ layer has a plurality of body bias areas arranged in a second predetermined pattern to define a plurality of buried oxides (BOXs), whereby the plurality of BOXs are respectively exposed via the plurality of openings,
wherein the device is made by a method comprising:
preparing a donor silicon wafer comprising:
applying a sacrificial SiGe layer on a silicon substrate wafer;
depositing a donor silicon layer on the SiGe layer;
etching the donor silicon layer to form at least one opening in the silicon layer;
wet etching the sacrificial SiGe layer through the at least one opening in the silicon layer to partially remove SiGe material from the sacrificial SiGe layer and preserve the donor silicon layer;

depositing an $SiO_2$ layer on the donor silicon layer;
etching the $SiO_2$ layer to form at least one body bias area; and
depositing or growing silicon, or polysilicon, in the at least one body bias area;
bonding a recipient handle wafer to the etched $SiO_2$ layer of the donor silicon wafer, whereby a BOX is defined by the donor silicon layer, the at least one body bias area, and the recipient handle wafer; and
wet etching the sacrificial SiGe layer to release the donor silicon wafer from the recipient handle wafer,
whereby the $SiO_2$ layer and the donor silicon layer remain bonded to the recipient handle wafer to form a fully depleted silicon-on-insulator (FD-SOI) wafer.

5. The device by a method as claimed in claim 4, wherein depositing the SiO2 layer on the donor silicon layer comprises filling the at least one opening with SiO2 material without bridging oxide material between the silicon substrate wafer and the donor silicon layer.

6. The device by a method as claimed in claim 4, comprising polishing the SiO2 layer and the at least one body bias area.

7. The device by a method as claimed in claim 4, wherein applying the sacrificial SiGe layer on the silicon substrate wafer comprises epitaxially growing the SiGe layer.

8. The device by a method as claimed in claim 4, wherein applying the sacrificial SiGe layer on the silicon substrate wafer produces the sacrificial SiGe layer having a thickness about ten times the thickness of the silicon substrate wafer.

9. The device by a method as claimed in claim 4, wherein the at least one opening in the silicon layer comprises a dummy fill opening.

10. The device by a method as claimed in claim 4, wherein etching the donor silicon layer to form the at least one opening in the silicon layer comprises etching the silicon layer to form a plurality of openings in the silicon layer in a first predetermined pattern.

11. The device by a method as claimed in claim 4, wherein etching the SiO2 layer to form the at least one body bias area comprises etching the buried oxide layer to form a plurality of body bias areas in a second predetermined pattern.

12. The device by a method as claimed in claim 4, wherein depositing the SiO2 layer on the donor silicon layer comprises filling the at least one opening with SiO2.

13. The device by a method as claimed in claim 4, comprising patterning the sacrificial SiGe layer with a shallow trench isolation mask.

14. The device by a method as claimed in claim 4, comprising patterning the SiO2 layer to define the at least one body bias area in the SiO2 layer.

15. The device by a method as claimed in claim 4, comprising polishing the SiO2 layer and the at least one body bias area to planarize the SiO2 layer.

16. The device by a method as claimed in claim 4, comprising doping an implant in the recipient handle wafer.

17. The device as claimed in claim 1, wherein a respective BOX region includes multiple exposure plugs exposed through multiple openings in the silicon layer.

18. The device as claimed in claim 1, wherein the silicon layer and the exposure plug have exterior surfaces in the same plane.

19. The device as claimed in claim 1, wherein the $SiO_2$ layer, including the BOX regions separated by body bias areas, has a planarized lower surface in contact with the silicon substrate.

20. The device as claimed in claim 1, wherein the openings in the silicon layer comprise openings defining silicon sidewalls having a taper.

\* \* \* \* \*